(12) United States Patent
Itoh et al.

(10) Patent No.: US 7,054,610 B1
(45) Date of Patent: May 30, 2006

(54) WIRELESS TERMINAL DEVICE

(75) Inventors: Kenji Itoh, Hyogo (JP); Hiroaki Nagano, Hyogo (JP); Takatoshi Katsura, Hyogo (JP); Shinjirou Fukuyama, Hyogo (JP); Mitsuru Mochizuki, Hyogo (JP); Yoshinori Matsunami, Hyogo (JP); Mitsuhiro Shimozawa, Hyogo (JP); Fumio Ishizu, Hyogo (JP); Ryoji Hayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 844 days.

(21) Appl. No.: 09/694,675

(22) Filed: Oct. 24, 2000

Related U.S. Application Data

(63) Continuation of application No. PCT/JP99/07396, filed on Dec. 28, 1999.

(30) Foreign Application Priority Data

Feb. 24, 1999 (JP) .................. PCT/JP99/00830

(51) Int. Cl.
*H04B 1/30* (2006.01)
(52) U.S. Cl. .............. 455/324; 455/213; 455/258; 455/337
(58) Field of Classification Search ............... 455/324, 455/213, 255, 258, 259, 290, 291, 293, 307, 455/313, 318–20, 330, 334, 323, 337, 343.2; 327/317
See application file for complete search history.

(56) References Cited

U.S. PATENT DOCUMENTS

| | | | |
|---|---|---|---|
| 5,471,665 A | * | 11/1995 | Pace et al. ............... 455/343.2 |
| 5,787,126 A | | 7/1998 | Itoh et al. .................. 375/340 |
| 6,016,422 A | * | 1/2000 | Bartusiak ................ 455/324 X |
| 6,118,322 A | * | 9/2000 | Bockelman et al. ........ 327/317 |

(Continued)

FOREIGN PATENT DOCUMENTS

JP         61-169030         7/1986

(Continued)

OTHER PUBLICATIONS

Shimozawa et al., "A Monolithic Even Harmonic Quadrature Mixer Usinga Balance Type 90 Degree Phase Shifter for Direct Conversion Receivers" *Technical Report of Ieice*, MW98-62 (Jul. 1998), pp. 33-37.

(Continued)

*Primary Examiner*—Nay Maung
*Assistant Examiner*—Philip Sobutka
(74) *Attorney, Agent, or Firm*—Rothwell, Figg, Ernst & Manbeck, PC

(57) ABSTRACT

In a cellular telephone provided with a receiving circuit of a direct conversion type, a passive low-pass filter is arranged between a mixer for an I-channel and a base band circuit for removing interference waves of or above a channel next to a channel neighboring to the I-channel, and another passive low-pass filter is arranged between a mixer for a Q-channel and the base band circuit for removing interference waves of or above a channel next to a channel neighboring to the Q-channel. Since the low-pass filters for removing the interference waves of or above the channel next to the neighboring channel are of a differential type, the circuit scale can be small, and the power consumption is small. Since the interference waves are removed by the passive low-pass filters and the active low-pass filters, only the desired channel can be reliably received.

22 Claims, 11 Drawing Sheets

U.S. PATENT DOCUMENTS 6,236,847 B1 * 5/2001 Stikvoort ................. 455/313

FOREIGN PATENT DOCUMENTS

| | | |
|---|---|---|
| JP | 8-242261 | 9/1996 |
| JP | 9-191264 | 7/1997 |
| JP | 10-22860 | 1/1998 |
| JP | 10-32516 | 2/1998 |
| JP | 10-224249 | 8/1998 |

OTHER PUBLICATIONS

Shimozawa et al., "A Monolithic Even Harmonic Quadrature Mixer Using a Balance Type 90 Degree Phase Shifter for Direct Conversion Receivers"; 1998 IEEE Radio Frequency Integrated Circuits Symposium; 1998 IEEE Baltimore, MD, USA, Jun. 7-9, 1998; New York, NY, USA, IEEE Jun. 7, 1998; pp. 209-212.

* cited by examiner

FREQUENCY CHARACTERISTICS OF PLPF1+PLPF2

WIRELESS TERMINAL DEVICE

REFERENCE TO RELATED APPLICATION

This application is a continuation of International Application No. PCT/JP99/07396, whose international filing date is Dec. 28, 1999, the disclosure of which is incorporated by reference herein.

BACKGROUND OF THE INVENTION

1. Field of the Invention

The present invention relates to a wireless terminal device, and particularly, a wireless terminal device provided with a direct conversion receiving circuit using an orthogonal mixer of a differential type.

2. Description of the Background Art

At present, wireless terminal devices such as a cellular telephone primarily employ heterodyne receiving circuits. Although the heterodyne system requires an intermediate frequency circuit, it can prevent leak of a local oscillation signal to an antenna side because the local oscillation frequency is different from the receive frequency, and therefore can prevent deterioration of sensitivity.

In contrast to this, a direct conversion (homodyne) system does not require an intermediate frequency circuit, but the local oscillation signal leaks to the antenna side, and therefore the sensitivity deteriorates because the local oscillation frequency is equal to the receiving frequency.

In the heterodyne system, the intermediate frequency circuit can hardly remove channels (which will also be referred to as "interference waves" hereinafter) other then a desired channel. In the direct conversion system, however, the interference waves are hardly attenuated, and are supplied to a base band circuit. Therefore, the base band circuit is required to have extremely high anti-interference-wave characteristics. However, for increasing the anti-interference-wave characteristics, it is generally required to increase a current flowing through the base band circuit. Therefore, the anti-interference-wave characteristics of the receiving circuit can be improved only to a limited extent.

In general, cellular telephones are strongly required to have small sizes, light weight and low power consumption. Therefore, it is desired to reduce the number of components of the cellular telephone.

Japanese Patent Laying-Open No. 10-224249 has disclosed in FIG. 5 a direct conversion receiver having a low-pass filer, which selects a signal of only a desired channel from a base band signal sent from an orthogonal mixer while suppressing a signal of a neighboring channel. However, this low-pass filter is not specifically disclosed.

Japanese Patent Laying-Open Nos. 10-22860 and 10-32516 have disclosed low-pass filters similar to the foregoing low-pass filter, but have not disclosed specific structures and operations.

SUMMARY OF THE INVENTION

An object of the invention is to provide a wireless terminal device, of which parts are reduced in number as far as possible.

Another object of the invention is to provide a small wireless terminal device, in which entry of interference waves into a base band circuit is suppressed as far as possible.

According to the invention, a wireless terminal device for selectively receiving a desired channel from a plurality of channels includes an antenna, a local oscillator, a first mixer of a differential type, a first low-pass filter of a differential type and a passive type, and a base band circuit. The antenna receives a radio-frequency signal including the plurality of channels. The local oscillator oscillates a local oscillation signal. The first mixer mixes the radio-frequency signal sent from the antenna with the local oscillation signal sent from the local oscillator to produce a first base band signal and a second base band signal having a phase differing by 180 degrees from that of the first base band signal. The first low-pass filter receives the first and second base band signals from the first mixer. The base band circuit receives the first and second base band signals passed through the first low-pass filter.

Preferably, the first low-pass filter includes a first inductance, a second inductance and a capacitor. The first inductance passes and transmits the first base band signal sent from the first mixer to the base band circuit. The second inductance passes and transmits the second base band signal sent from the first mixer to the base band circuit. The capacitor is coupled between the first and second inductances.

In the above wireless terminal device, the first low-pass filter for removing interference waves sent toward the base band circuit is of the differential type and the passive type. Therefore, parts of the first low-pass filter are small in number, and a power consumption thereof is small.

Preferably, the first low-pass filter has a cut-off frequency lower than a channel next to a channel neighboring to the desired channel.

More preferably, the base band circuit includes an active low-pass filter. The active low-pass filter receives the first and second base band signals passed through the first low-pass filter, and has a cut-off frequency lower than the channel neighboring to the desired channel.

In this wireless terminal device, the first low-pass filter removes interference waves of or above the channel next to the neighboring channel, which cannot be sufficiently removed by the active low-pass filter.

According to another aspect, the invention provides a wireless terminal device for selectively receiving a desired channel from a plurality of channels, includes an antenna, a local oscillator, a first mixer of a differential type, a first low-pass filter of a passive type, a second low-pass filter of the passive type, and a base band circuit. The antenna receives a radio-frequency signal including the plurality of channels. The local oscillator oscillates a local oscillation signal. The first mixer mixes the radio-frequency signal sent from the antenna with the local oscillation signal sent from the local oscillator to produce a first base band signal and a second base band signal having a phase differing by 180 degrees from that of the first base band signal. The first low-pass filter receives the first and second base band signals from the first mixer. The second low-pass filter receives the first and second base band signals passed through the first low-pass filter, and has a cut-off frequency higher than that of the first low-pass filter. The base band circuit receives the first and second base band signals passed through the second low-pass filter.

Preferably, the first low-pass filter has a cut-off frequency than that of a channel next to a channel neighboring to the desired channel.

More preferably, the cut-off frequency of the second low-pass filter is set in accordance with deterioration of attenuation characteristics in a radio-frequency range of the first low-pass filter.

In this wireless terminal device, even when the attenuation characteristics of the first low-pass filter for the radio-frequency range deteriorate, the second low-pass filter can attenuate signals in the above radio-frequency range so that interference waves other than the desired channel can be effectively prevented from entering the base band circuit, and can be effectively removed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A cellular telephone of an embodiment of the invention will now be described with reference to the drawings. In the figures, the same or corresponding portions bear the same reference numbers, and description thereof is not repeated.

First Embodiment

Figure 1:
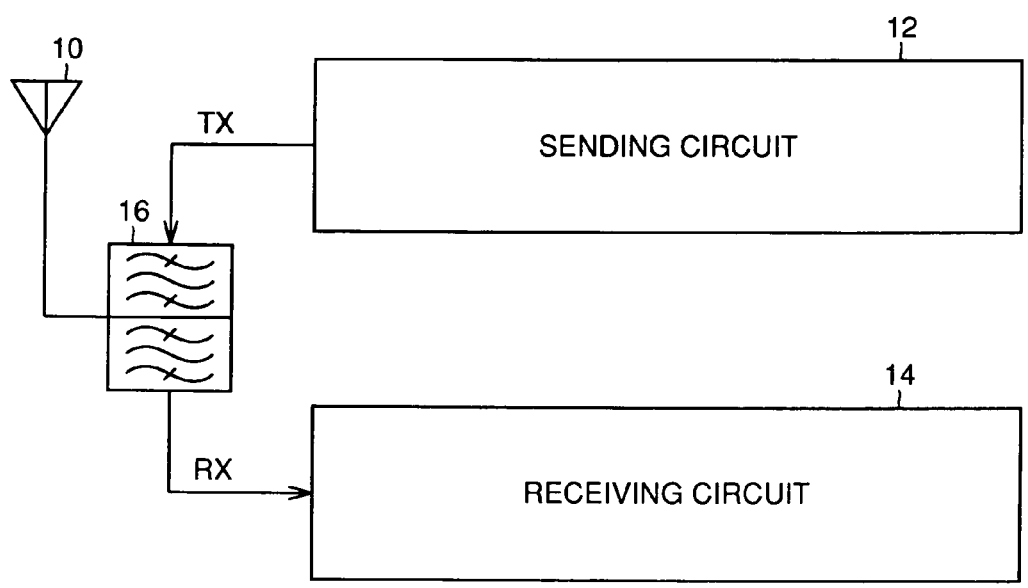
FIG. 1 is a block diagram showing a whole structure of a cellular telephone of a first embodiment of the invention.

Referring to FIG. 1, a cellular telephone which is a kind of wireless terminal device includes an antenna 10, a transmitting (sending) circuit 12, a receiving circuit 14 and a transmission/reception branching filter 16.

This cellular telephone employs a CDMA (Code Division Multiple Access) scheme, and simultaneously performs transmission and reception via single antenna 10. Therefore, the transmitting frequency is different from the receiving frequency and, in this embodiment, is lower than the receiving frequency. Therefore, the transmission/reception branching filter 16 is formed of a band-pass filter passing only a transmitting wave TX therethrough and a band-pass filter passing only a received wave RX therethrough, and hardly passes transmitting wave TX toward receiving circuit 14.

Figure 2:
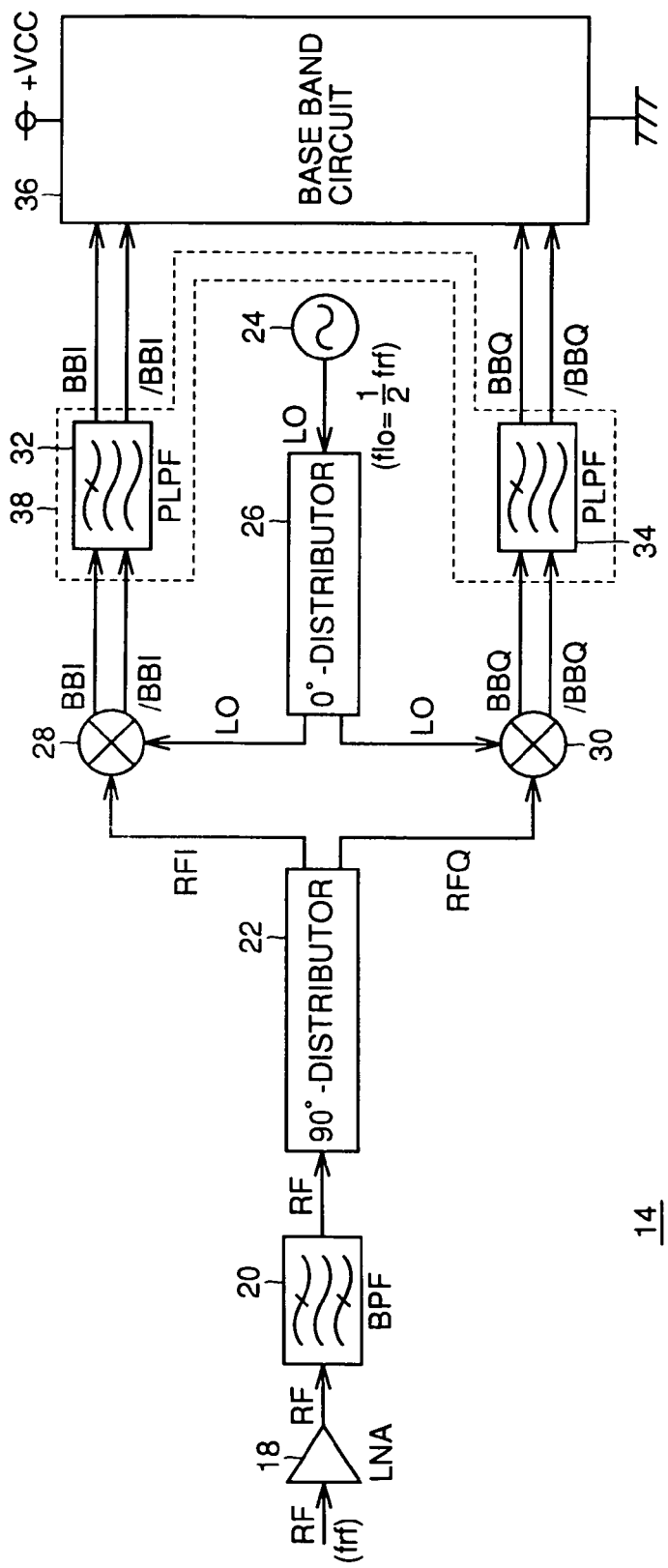
FIG. 2 is a block diagram showing a specific structure of a receiving circuit shown in FIG. 1.

Referring to FIG. 2, receiving circuit 14 includes a low-noise amplifier (LNA) 18, a band-pass filter (BPF) 20, a 90'-distributor 22, a local oscillator 24, an in-phase 0° distributor 26, even harmonic mixers 28 and 30, passive low-pass filters 32 and 34, and a base band circuit 36.

Low-noise amplifier 18 amplifies received wave RX (which will be referred to as a "received radio-frequency signal RF" hereinafter) passed through transmission/reception branching filter 16 with high SN ratio. Band-pass filter 20 removes unnecessary signals, and passes only necessary radio-frequency signal RF. 90°-distributor 22 produces radio-frequency signals RFI and RFQ for an I-channel and a Q-channel based on radio-frequency signal RF passed through band-pass filter 20. Local oscillator 24 oscillates a local oscillation signal LO. A frequency flo of local oscillation signal LO is equal to half a frequency frf of radio-frequency signal RF. 0°-distributor 26 distributes local oscillation signal LO sent from local oscillator 24 to even harmonic mixers 28 and 30. Local oscillation signals LO applied to even harmonic mixers 28 and 30 have the same phase.

Even harmonic mixer 28 mixes radio-frequency signal RFI sent from 90°-distributor 22 with local oscillation signal LO sent from 0°-distributor 26, and thereby produces I-channel base band signals BBI and /BBI. Even harmonic mixer 28 is of a differential type (balanced type), and base band signals BBI and /BBI have phases shifted by 180 degrees from each other. Likewise, even-harmonic mixer 30 mixes radio-frequency signal RFQ sent from 90'-distributor 22 with local oscillation signal LO sent from 0° -distributor 26, and thereby produces Q-channel base band signals BBQ and /BBQ. Even harmonic mixer 30 is of a differential type (balanced type), and base band signals BBQ and /BBQ have phases shifted by 180 degrees from each other. Thus, even harmonic mixers 28 and 30 form an orthogonal mixer as a whole.

Low-pass filter 32 is of a differential type (balanced type) and a passive type, and receives base band signals BBI and /BBI sent from even harmonic mixer 28. As will be described layer, low-pass filter 32 allows passage of only a desired channel and a neighboring channel (i.e., a channel neighboring to the desired channel), and attenuates interference waves of or above a channel next to the neighboring channel. Likewise, low-pass filter 34 is of a differential type (balanced type) and a passive type, and receives base band signals BBQ and /BBQ sent from even harmonic mixer 30. As will be described layer, low-pass filter 34 allows passage of only a desired channel and a neighboring channel, and attenuates interference waves of or above a channel next to the neighboring channel.

For reducing parts in number, low-pass filters 32 and 34 are desirably formed of a single element 38 such as a ceramic filter.

Base band circuit 36 receives base band signals BBI and /BBI sent through low-pass filter 32 and base band signals BBQ and /BBQ sent through low-pass filter 34. Since base band circuit 36 receives the base band signals BBI and /BBI as well as base band signals BBQ and /BBQ of the differential type as described above, it can operate only with a positive power supply. More specifically, the base band circuit 36 is driven between the positive power supply voltage +VCC (e.g., 3 V) and a ground voltage (0 V).

Instead of employing 90'-distributor 22, radio-frequency signal RF sent from band-pass filter 20 may be applied to even harmonic mixer 28 as it is, and a phase shifter may be employed for shifting the phase of radio-frequency signal RF by 90 degrees and applying it to even harmonic mixer 30.

Figure 3:
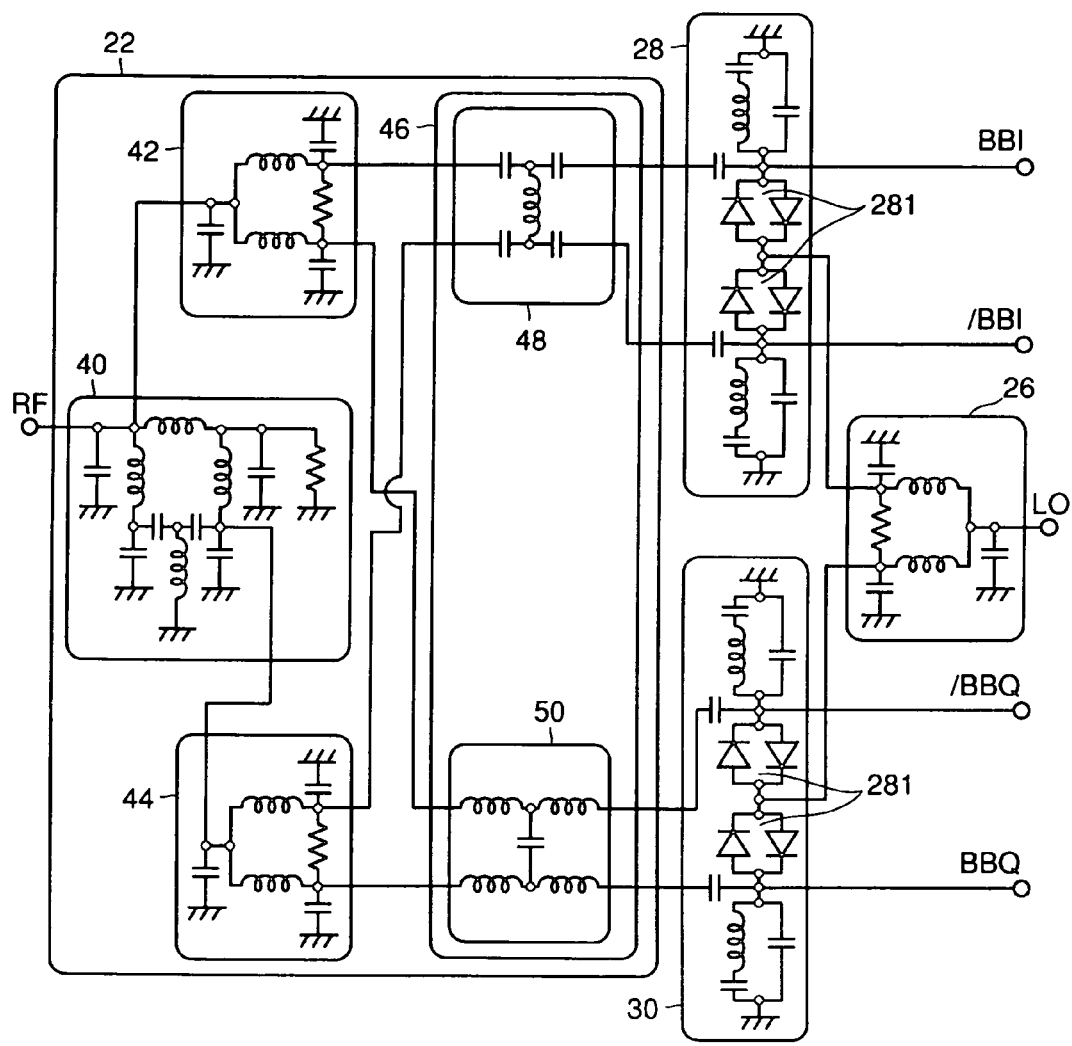
FIG. 3 is a circuit diagram showing specific structures of a 90°-distributor, an even harmonic mixer and an in-phase distributor shown in FIG. 2.

Referring to FIG. 3, 90°-distributor 22 includes a reverse phase (180°) distributor 40, two in-phase (0°) distributors 42 and 44, and a differential (balanced) 90°-phase shifter 46. Phase shifter 46 includes a differential (balanced) high-pass filter 48, and a differential (balanced) low-pass filter 50. 180'-distributor 40 receives radio-frequency signal RF from band-pass filter 20, and applies radio-frequency signals of phases, which are shifted by 180 degrees from each other, to 0°-distributors 42 and 44, respectively. 0°-distributor 42 applies radio-frequency signals of the same phase to high-pass filter 48 and low-pass filter 50. 0°-distributor 44 applies radio-frequency signals of the same phase to high- and low-pass filters 48 and 50, respectively. High-pass filter 48 advances the phase of received radio-frequency signal by 45 degrees, and applies it to even harmonic mixer 28. Low-pass filter 50 delays the phase of received radio-frequency signal by 45 degrees, and applies it to even harmonic mixer 30. As a result, 90°-distributor 22 applies radio-frequency signals RFI and RFQ having phases shifted by 90° from each other to even harmonic mixers 28 and 30, respectively.

Referring to FIG. 3, description has been made on the structure, in which the differential orthogonal mixer is formed of even harmonic mixers 28 and 30. Instead of these even harmonic mixers, it is possible to use general differential mixers such as diode-balanced mixers or other balanced mixers, e.g., of Gilbert cells using transistors. However, the even harmonic mixers can achieve peculiar effects described below.

Operations of the even harmonic mixers will now be described briefly. Assuming that the supplied radio-frequency signal RF has a frequency of frf, and the supplied local oscillation signal LO has a frequency of flo, the output base band signal has a frequency fbb expressed by the following formula:

$$fbb = m \cdot frf \pm n \cdot flo$$

where m and n are integers, respectively.

In the even harmonic mixer, a frequency conversion efficiency is low when (m+n) is an even number, and the frequency conversion efficiency is high when (m+n) is an odd number. This is because a mixed wave current in the even orders forms a loop current flowing through antiparallel diode pair 281 (FIG. 3), and is not externally output.

More specifically, in the case of m=1 and n=2, the base band signal has frequency fbb expressed by the following formula:

$$fbb = frf - 2 \cdot flo$$

Since there is a relationship of flo=frf/2 as described above, a base band signal of a low frequency (fbb=0) can be obtained with a high conversion efficiency.

Accordingly, the radio-frequency received by antenna 10 is directly converted to a low frequency without being temporarily converted to an intermediate frequency. Further, leakage of the local oscillation signal toward antenna 10, which may deteriorate the sensitivity, does not occur because local oscillation frequency flo is equal to half the received frequency frf.

The differential orthogonal mixer shown in FIG. 3 is disclosed in FIG. 2 of "Monolithic Even Harmonic Orthogonal Mixer Using Balanced 90°-Phase-Shifer Circuit" (Mitsuhiro Shimozawa et al, Shingaku Gihou, MW98-62 (1998-07), page 35. Even harmonic orthogonal mixer and a general differential mixer are described more specifically in U.S. Pat. No. 5,787,126 (Japanese Patent Laying-Open No. 8-242261), and therefore are not described in further greater detail.

Figure 4:
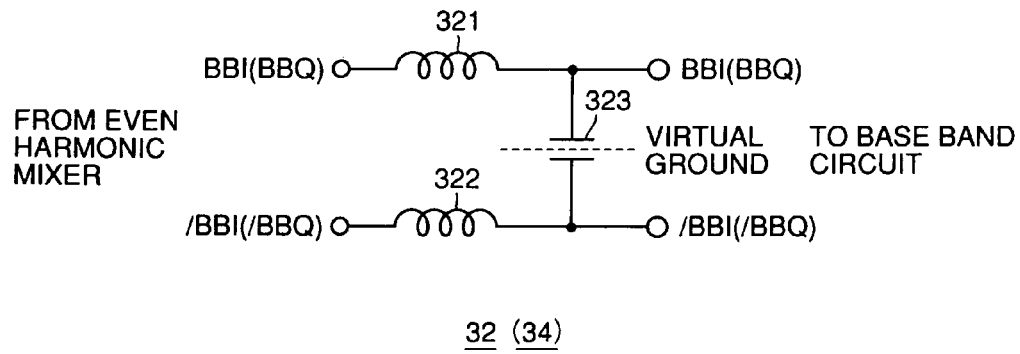
FIG. 4 is a circuit diagram showing a specific structure of a passive low-pass filter shown in FIG. 2.

Referring to FIG. 4, passive low-pass filter 32 includes two inductors 321 and 322 as well as a capacitor 323. Inductor 321 passes base band signal BBI sent from even harmonic mixer 28 therethrough, and transmits it to base band circuit 36. Inductor 322 passes base band signal /BBI sent from even harmonic mixer 28 therethrough, and transmits it to base band circuit 36. Inductors 321 and 322 function as choke coils for removing radio-frequency signal RF leaking from the side of antenna 10. Capacitor 323 is coupled between inductors 321 and 322. Another inductance which is connected in series to inductor 321 may be interposed between capacitor 323 and base band circuit 36, and another inductance which is connected in series to inductor 322 may be interposed between capacitor 323 and base band circuit 36. Passive low-pass filter 34 on the Q-channel side has a structure similar to passive low-pass filter 32 on the I-channel side described above.

Figure 5:
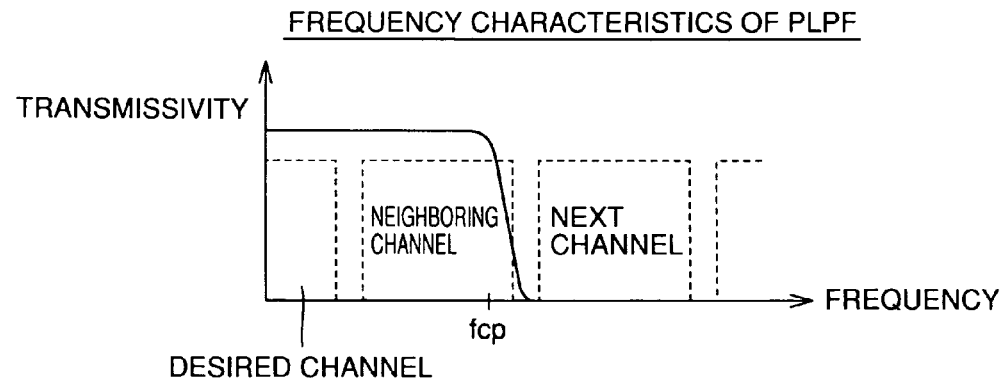
FIG. 5 shows frequency characteristics of the passive low-pass filter shown in FIG. 2.

Referring to FIG. 5, passive low-pass filters 32 and 34 have a cut-off frequency fcp lower than the channel next to the neighboring channel. Therefore, passive low-pass filters 32 and 34 suppress the channels next to or above the neighboring channel, and allow passage of only the desired channel and the neighboring channel.

Since the low-pass filters 32 and 34 are of the passive type, the cut-off frequency can be set to a high value allowing passage of the channels not higher than the neighboring channel. Consequently, sizes thereof can be reduced even if it is the base band frequency.

Figure 6:
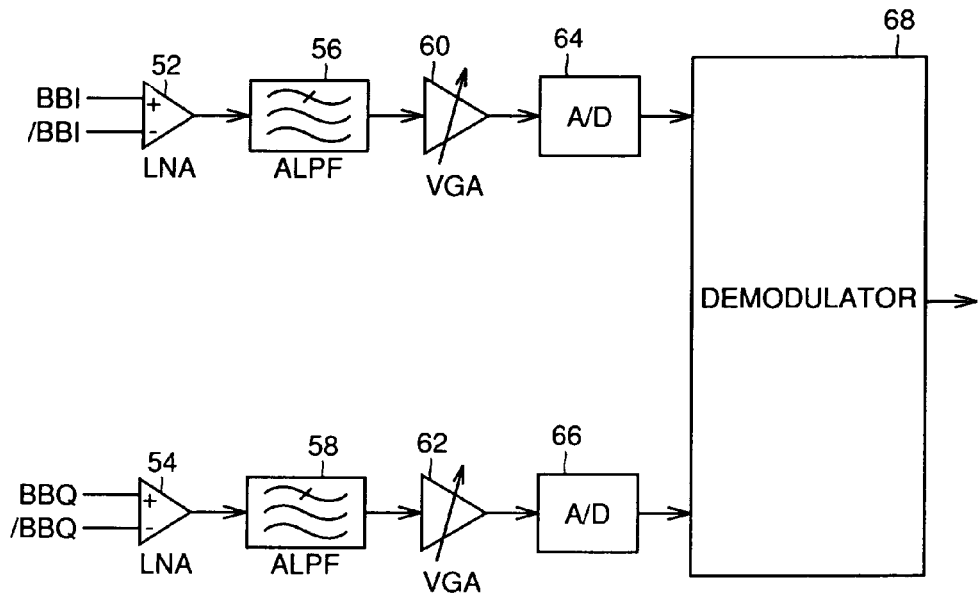
FIG. 6 is a block diagram showing a specific structure of a base band circuit shown in FIG. 2.

Referring to FIG. 6, base band circuit 36 includes low-noise amplifiers (LNAs) 52 and 54, active low-pass filters (ALPFs) 56 and 58, variable-gain amplifiers (VGAs) 60 and 62, A/D converters 64 and 66, and a demodulator 68.

Low-noise amplifier 52 is of a differential type, and receives base band signals BBI and /BBI from low-pass filter 32 on the I-channel side. Low-noise amplifier 54 is likewise of a differential type, and receives base band signals BBQ and /BBQ from low-pass filter 34 on the Q-channel side.

Active low-pass filter 56 receives the output signal of low-noise amplifier 52, and removes interference waves of or above the neighboring channel for allowing passage of only the desired channel. Active low-pass filter 58 receives the output signal of low-noise amplifier 54, and removes interference waves of or above the neighboring channel for allowing passage of only the desired channel.

Variable-gain amplifier 60 amplifies the output signal sent from low-pass filter 56 with an appropriate gain so that the output level of A/D converter 64 may be always constant. Variable-gain amplifier 62 amplifies the output signal sent from low-pass filter 58 with an appropriate gain so that the output level of A/D converter 66 may be always constant.

A/D converter 64 performs A/D (analog-to-digital) conversion of the output signal of variable-gain amplifier 60, and applies it to demodulator 68. A/D converter 66 performs A/D (analog-to-digital) conversion of the output signal of variable-gain amplifier 62, and applies it to demodulator 68. Demodulator 68 demodulates the I-channel base band signal sent from A/D converter 64 and the Q-channel base band signal sent from A/D converter 66 for producing a low-frequency (audio) signal.

Differential amplifiers 52 and 54 may be eliminated, and low-pass filters 56 and 58 may be of a differential type, in which case base band signals BBI, /BBI, BBQ and /BBQ are directly supplied to low-pass filters 56 and 58.

Figure 7:
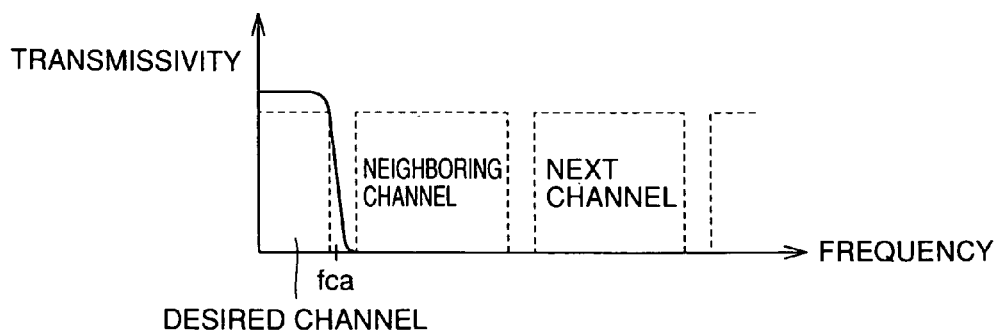
FIG. 7 shows frequency characteristics of a passive low-pass filter shown in FIG. 6.

Referring to FIG. 7, active low-pass filters 56 and 58 have a cut-off frequency fca lower than the neighboring channel. Therefore, low-pass filters 56 and 58 allow passage of only the desired channel by suppressing the channels neighboring to and exceeding the desired channel.

Operations of the cellular telephone having the foregoing structure will now be described.

Radio-frequency signal RF received on antenna 10 is amplified by low-noise amplifier 18, and then is sent to 90'-distributor 22 via band-pass filter 20. Radio-frequency signal RF applied to 90'-distributor 22 is distributed to even harmonic mixers 28 and 30 with a phase difference of 90 degrees therebetween. Even harmonic mixer 28 directly converts radio-frequency signal RFI sent from 90'-distributor 22 to base band signals BBI and /BBI of a low frequency, which are applied to base band circuit 36 via passive low-pass filter 32. Even harmonic mixer 30 directly converts radio-frequency signal RFQ sent from 90'-distributor 22 to base band signals BBQ and /BBQ of a low frequency, which are applied to base band circuit 36 via passive low-pass filter 34. Since local oscillation frequency flo is equal to half the frequency frf of radio-frequency signal RF, even harmonic mixers 28 and 30 hardly perform second (even-order) frequency conversion even when local oscillation signal LO leaks to antenna 10. Therefore, unnecessary leaked signal does not reach base band circuit 36. As a result, the sensitivity does not deteriorate.

Low-pass filters 32 and 34 may have structures of a non-differential (unbalanced) type, in which one capacitor is connected to each of inductors 321 and 322. However, the differential type shown in FIG. 4 can reduce the number of required capacitors by one.

Since low-pass filters 32 and 34 are not of the active type but of the passive type, anti-interference-waves characteristics (or a resistance against interference waves) of receiving circuit 14 can be improved without increasing the currents flowing through the active elements including and following the active low-pass filters 56 and 58.

Base band signals BBI and /BBI applied to base band circuit 36 are amplified by low-noise amplifier 52, and are applied to variable-gain amplifier 60 via active low-pass filter 56. The base band signals thus applied are appropriately amplified by variable-gain amplifier 60, and are applied to demodulator 68 after being subjected to the A/D conversion by A/D converter 64. Base band signals BBQ and /BBQ applied to base band circuit 36 are amplified by low-noise amplifier 54, and are applied to variable-gain amplifier 62 via active low-pass filter 58. The base band signals thus applied are appropriately amplified by variable-gain amplifier 62, and are applied to demodulator 68 after being subjected to the A/D conversion by A/D converter 66. The base band signals thus A/D-converted are demodulated to a low-frequency (audio) signal by demodulator 68.

Since low-pass filters 56 and 58 are not of the passive type but of the active type, steep frequency characteristics can be employed, although they require the currents. Therefore, the interference waves of the neighboring channel, which cannot be removed by passive low-pass filters 32 and 34, can be sufficiently removed. By employing low-pass filters 56 and 58 of the active type as described above, cut-off frequency fca can be considerably lowered. Low-pass filters 56 and 58, which are of the active type, do not necessarily operate as filters for frequencies other than the operation-guaranteed frequency. However, the interference waves of the channels next to or above the neighboring channel are removed in advance by passive low-pass filters 32 and 34 so that active low-pass filters 56 and 58 are merely required to remove reliably the interference waves of the neighboring channel. By employing the low-pass filters 32 and 34 as well as 56 and 58 of the foregoing structures, the interference waves can be reliably removed by the simple structures, and the power consumption can be reduced.

According to the first embodiment, as described above, the circuit scale can be small, and the power consumption can be reduced because low-pass filters 32 and 34 are of the passive type and the differential type. Since low-pass filters 32 and 34 are formed of single element 38 such as a ceramic filter, the required parts can be reduced in number.

By employing even harmonic mixers 28 and 30, the receiving circuit 14 can be employed without causing leakage of the local oscillation signal to antenna 10, and thus deterioration of sensitivity can be prevented, although the receiving circuit 14 is of the direct conversion type.

Since passive low-pass filters 32 and 34 as well as active low-pass filters 56 and 58 remove the interference waves in a complementary manner, saturation of the circuit operation is prevented. Consequently, the cellular telephone can selectively receive only the desired channel among the plurality of channels.

Second Embodiment

A second embodiment relates to a structure of a cellular telephone, which is an example of a wireless device, and can further suppress entry of the interference waves of the channel other than the desired channel into the base band circuit.

First, description will be made on a problem of deterioration of attenuation characteristics in a high frequency range, which may arise during transmission (sending and receiving) of the cellular telephone employing the CDMA scheme already described in the first embodiment.

For the transmission according to the CDMA scheme, passive low-pass filters 32 and 34 in receiving circuit 14 must have cut-off frequency fcp (FIG. 5) which is set to about 5 MHz. In accordance with this, inductors 321 and 322 (FIG. 4) forming passive low-pass filters 32 and 34 must have inductance values of the order of several micro-henries (μH).

Figure 8:
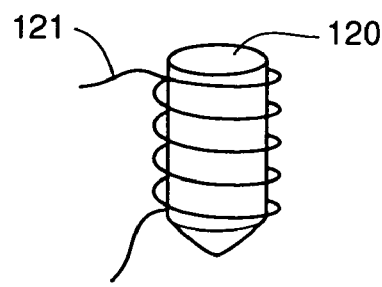
FIG. 8 shows an example of a structure of an inductance shown in FIG. 4.
Figure 9:
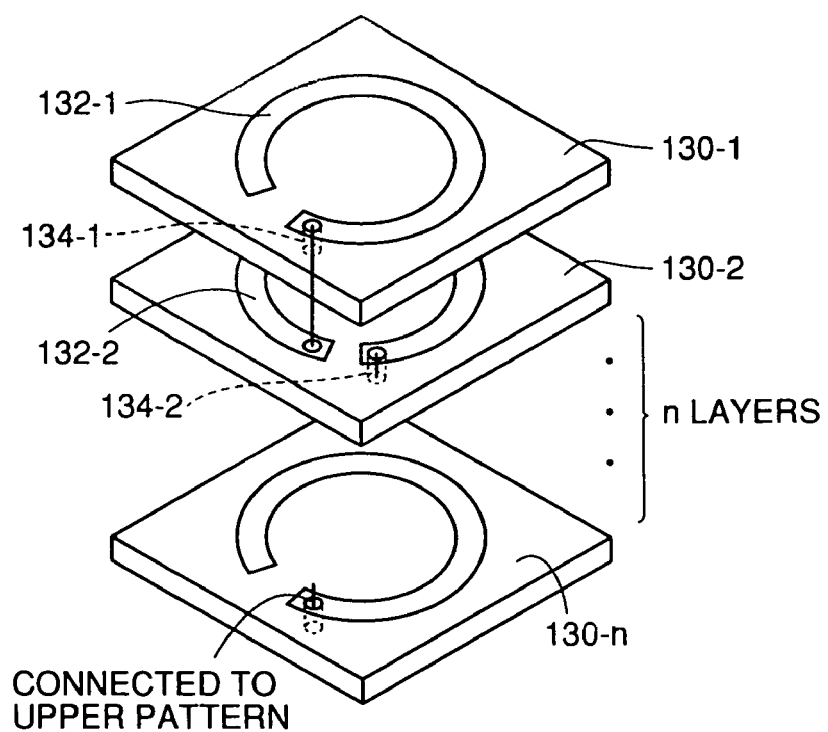
FIG. 9 shows another example of a structure of the inductance shown in FIG. 4.

For ensuring the inductance value of this order, Inductors which use ferrite as a base material and are shown in FIG. 8 or 9 are generally used.

Referring to FIG. 8, each of inductors 321 and 322 includes a ferrite core 120 and a coil winding 121 disposed around ferrite core 120.

Referring to FIG. 9, each of inductors 321 and 322 includes ferrite substrates 130-1–130-n, which are n (n: natural number) in number and are layered together. Ferrite substrates 130-1–130-n are provided with metal patterns 132-1-132-n and through holes 134-1–134-n, respectively. The metal pattern on each ferrite substrate is connected through the through hole to the metal pattern on the neighboring ferrite substrate to form the winding coil. For obtaining the inductance value of the order of several microhenries in the structure shown in FIG. 9, the number n of layers may be substantially equal to several tens.

The passive low-pass filters 32 and 34 formed of the foregoing inductances have self-resonance characteristics in a high frequency range due to influences of the frequency characteristics of the magnetic permeability of ferrite and coupling between the windings and the metal patterns. In the following description, passive low-pass filters 32 and 34 may be generally referred to as "passive low-pass filters PLPF1" hereinafter.

Figure 10:
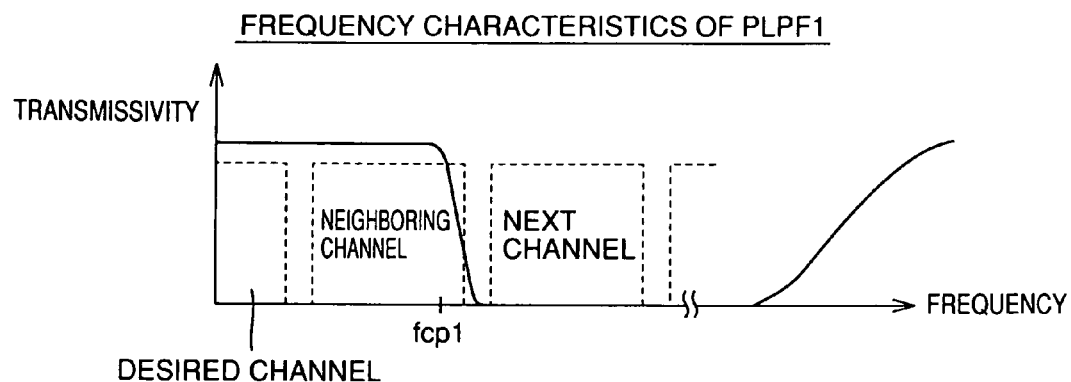
FIG. 10 shows frequency characteristics in a radio-frequency range of the passive low-pass filter shown in FIG. 2.

Referring to FIG. 10, the passive low-pass filter PLPF1 has such frequency characteristics that the attenuation characteristics in the high frequency range are deteriorated by the influence of the self-resonance characteristics described above.

Figure 11:
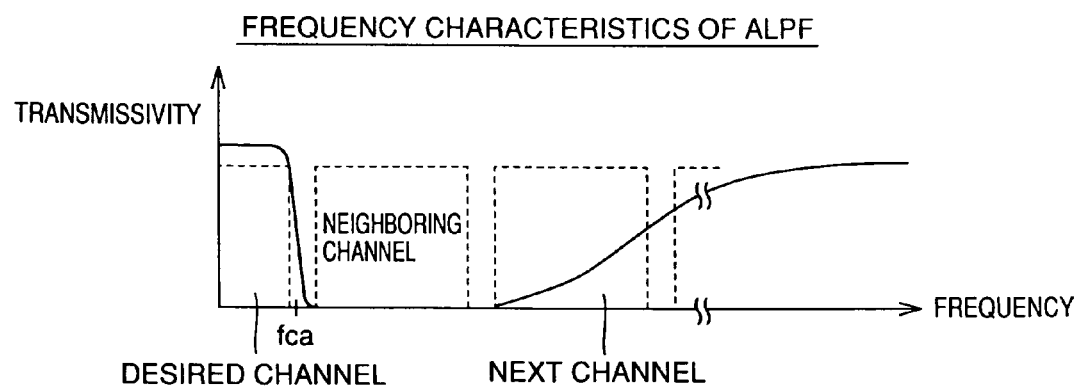
FIG. 11 shows frequency characteristics in a radio-frequency range of an active low-pass filter shown in FIG. 6.

Referring to FIG. 11, active low-pass filters 56 and 58 (which may also be referred to as "active low-pass filters ALPF" hereinafter) disposed in the base band circuit can have steep frequency characteristics. However, active low-pass filters ALPF may not operate as the filters in the range higher than the operation-guaranteed frequency due to the influence of the frequency characteristics of the semiconductor elements forming an operation amplifier and others contained therein, and do not have sufficient attenuation characteristics in the high frequency range causing deterioration of the attenuation characteristics of passive low-pass filters PLPF1.

Accordingly, only the combination of the passive low-pass filters PLPF1 and active low-pass filters ALPF is liable to be adversely affected by high frequency waves such as FM broadcast waves. Deterioration of the attenuation characteristics in the high frequency range of passive low-pass filters PLPF1 may be covered by the attenuation characteristics of active low-pass filters ALPF. For achieving this covering, however, expensive semiconductor elements are required for forming the active low-pass filters, resulting in a problem relating to cost.

The purpose of this cellular telephone, which is an example of the wireless device according to the second embodiment of the invention, is to overcome efficiently the problem relating to the deterioration of attenuation characteristics in the high frequency range described above.

The cellular telephone according to the second embodiment of the invention differs from the cellular telephone according to the first embodiment of the invention in the structure of the receiving circuit. Other structures relating to the antenna 10, sending circuit 12, transmission/reception branching filter 16 and others are the same as those of the first embodiment, and therefore description thereof is not repeated.

Figure 12:
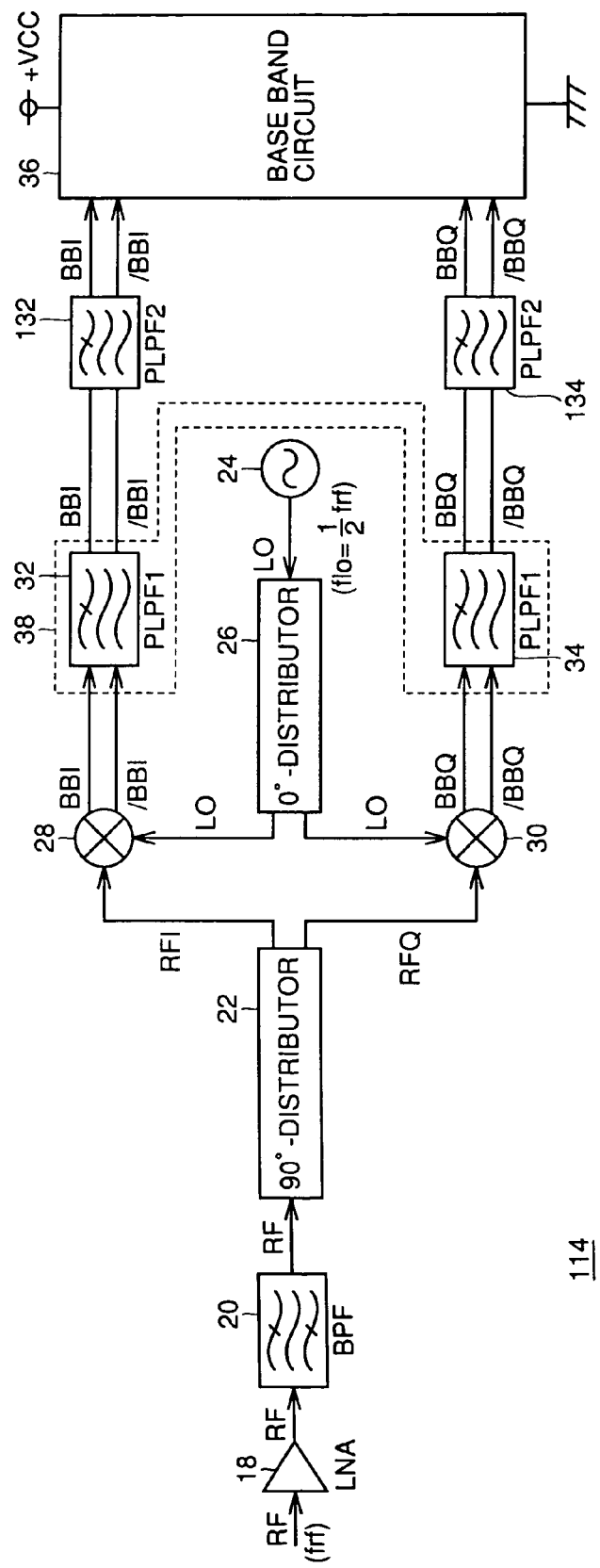
FIG. 12 is a block diagram showing a specific structure of a receiving circuit 114 in a cellular telephone according to a second embodiment of the invention.

Referring to FIG. 12, a receiving circuit 114 according to the second embodiment of the invention includes the structure of receiving circuit 14 according to the first embodiment of the invention, and additionally includes passive low-pass filters 132 and 134 disposed between passive low-pass filters 32 and 34 and base band circuit 36. Structures other than the above as well as the operations are the same as those of receiving circuit 14, and therefore description thereof is not repeated. In the following description, passive low-pass filters 132 and 134 may be generally referred to as "passive low-pass filters PLPF2" hereinafter.

Passive low-pass filter PLPF2 is provided for covering or compensating deterioration of the attenuation characteristics in the high frequency range, which may occur in passive low-pass filter PLPF1 corresponding to the CDMA scheme.

Figure 13:
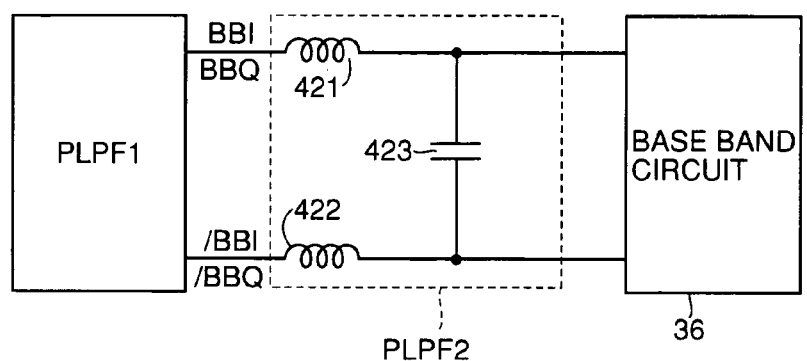
FIG. 13 is a circuit diagram showing an example of a specific structure of a passive low-pass filter shown in FIG. 12.

Referring to FIG. 13, each passive low-pass filter PLPF2 includes two inductors 421 and 422 as well as a capacitor 423. Inductor 421 asses base band signal BBI (BBQ) sent from passive low-pass filter PLPF1, and transmits it to base band circuit 36. Inductor 422 passes base band signal /BBI (/BBQ) sent from passive low-pass filter PLPF1, and transmits it to base band circuit 36. Capacitor 423 is coupled between inductors 421 and 422.

As will be described later in greater detail, passive low-pass filter PLPF2 has a cut-off frequency fcp2 which is set to a relatively high value, and therefore inductors 421 and 422 may be formed of air-core coils having a low inductance value. The passive low-pass filters using such inductors have a high self-resonance frequency, and therefore is suitable to the purpose of ensuring the attenuation characteristics in the high frequency range.

Figure 14:
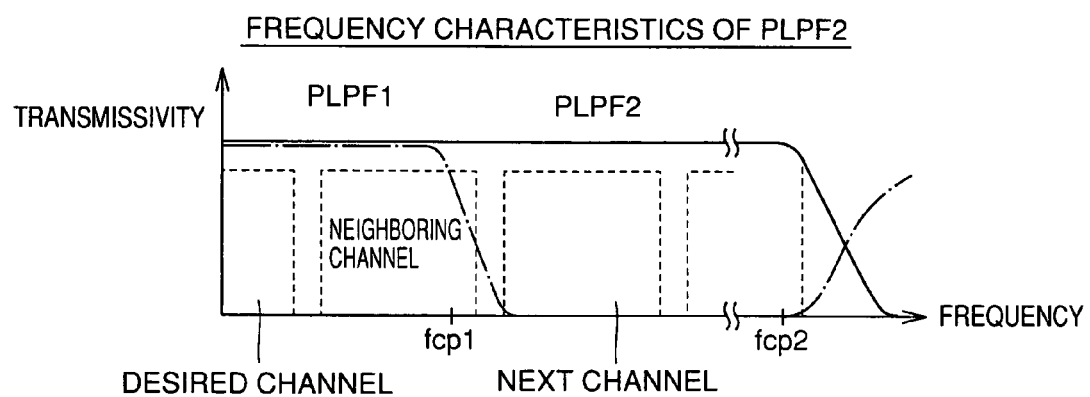
FIG. 14 shows frequency characteristics of the passive low-pass filter shown in FIG. 13.

Referring to FIG. 14, cut-off frequency fcp2 of passive low-pass filter PLPF2 is set to a value at which deterioration of the attenuation characteristics of passive low-pass filter PLPF1 starts. In passive low-pass filter PLPF1 having cut-off frequency fcp1 corresponding to the CDMA scheme, deterioration of the attenuation characteristics occurs in the frequency range higher than about 80 MHz, and therefore it is desired to set cut-off frequency fcp2 to about 80 MHz or more.

Figure 15:
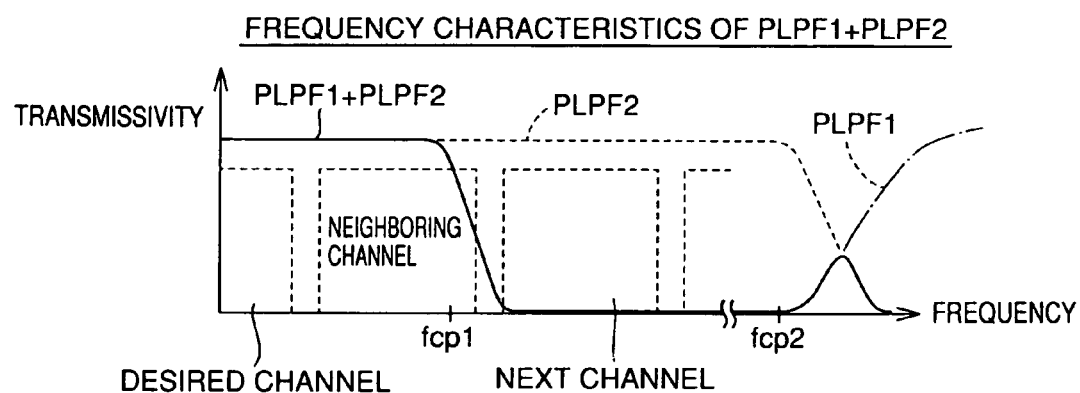
FIG. 15 shows frequency characteristics of the whole passive low-pass filter shown in FIG. 12.

Referring to FIG. 15, the entire passive low-pass filter structure, in which passive low-pass filters PLPF1 and PLPF2 are connected in series, can achieve sufficient attenuation characteristics in the region of or above cut-off frequency fcp1, and therefore can remove signals in the frequency range of the channels higher than the neighboring channel (i.e., the frequency range of the channels including or exceeding the channel next to the neighboring channel).

The whole filter structure, in which the above passive low-pass filters are combined with the active low-pass filters having the frequency characteristics shown in FIG. 7 arranged in base band circuit 36, can attenuate and remove the waves of the channels other than the desired channel.

Figure 16:
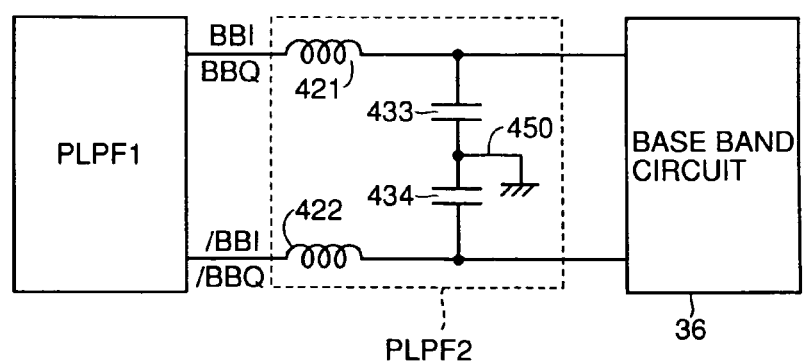
FIG. 16 is a circuit diagram showing another example of the specific structure of the passive low-pass filter shown in FIG. 12.

Referring to FIG. 16, passive low-pass filter PLPF2 may have such a structure that capacitors 433 and 434 are connected between the inductors 421 and 422 and the ground node 450. This structure increases the number of required parts, but can achieve the desired cut-off characteristics even in the in-phase mode.

Modification of Second Embodiment

A modification of the second embodiment will now be described in connection with another example of passive low-pass filter PLPF2. As already described, the inductance in passive low-pass filter PLPF2 shown in the second embodiment can have a small inductance value. Therefore, resistance elements may be used instead of the inductances for forming passive low-pass filter PLPF2.

Figure 17:
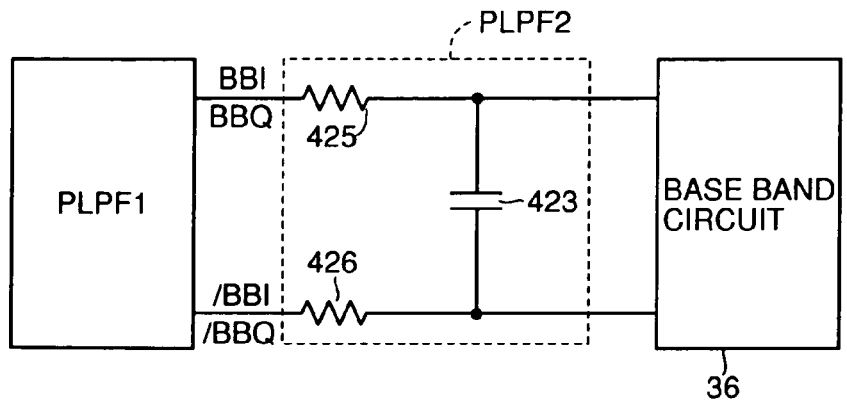
FIG. 17 is a circuit diagram showing an example of the specific structure of the passive low-pass filter according to a modification of the second embodiment of the invention.

Referring to FIG. 17, passive low-pass filter PLPF2 according to the modification of the second embodiment includes two resistance elements 425 and 426, and capacitor 423. Resistance element 425 is employed in place of inductor 421 shown in FIG. 13 for passing base band signal BBI (BBQ) sent from passive low-pass filter PLPF1 and transmitting it to base band circuit 36. Likewise, resistance element 426 is employed in place of inductor 422 shown in FIG. 13 for passing base band signal /BBI (/BBQ) sent from passive low-pass filter PLPF1 and transmitting it to base band circuit 36. Capacitor 423 is coupled between resistance elements 425 and 426.

Since the resistance element has small parasitic components of capacitance and inductance, self-resonance is suppressed in the passive low-pass filter formed of the resistance elements. As a result, the passive low-pass filter according to the modification of the second embodiment can further suppress deterioration of the attenuation characteristics in the radio-frequency range. By using the passive low-pass filter according to the modification of the second embodiment, therefore, the waves other than the desired channel can be attenuated and removed more reliably.

Figure 18:
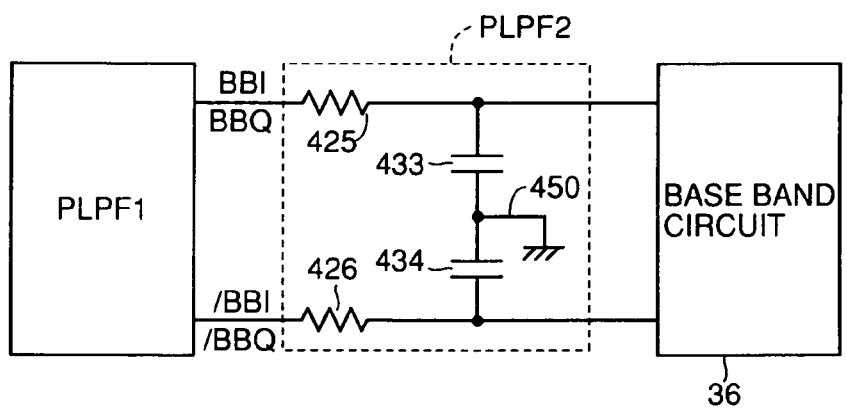
FIG. 18 is a circuit diagram showing another example of the specific structure of the passive low-pass filter according to the modification of the second embodiment of the invention.

Referring to FIG. 18, passive low-pass filter PLPF2 may have such a structure that capacitors 433 and 434 are connected between resistance elements 425 and 426 and ground node 450. This structure increases the number of required parts, but can achieve the desired cut-off characteristics even in the in-phase mode, similarly to the case shown in FIG. 16.

Since the cut-off frequency is high, the capacitor in passive low-pass filter PLPF2 can have a capacitance of a small value. Therefore, the passive low-pass filter according to the modification of the second embodiment, which is formed of the foregoing resistance elements and the capacitor, can be easily formed on a semiconductor substrate.

Figure 19:
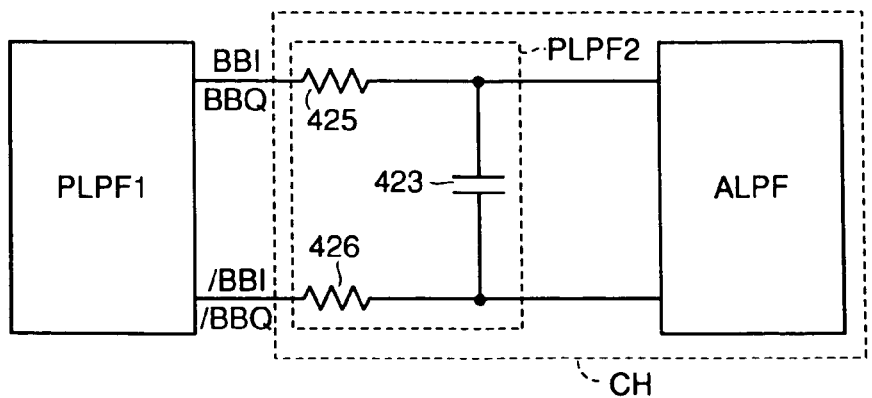
FIG. 19 is a block diagram showing an arrangement of the passive low-pass filter according to the modification of the second embodiment of the invention.

Referring to FIG. 19, two resistance elements 425 and 426 as well as capacitor 423, which form passive low-pass filter PLPF2 according to the modification of the second embodiment, are arranged on a semiconductor substrate CH which is also used as the substrate of active low-pass filter ALPF. The active low-pass filter ALPF is formed of an operation amplifier formed of a semiconductor element, a resistance element and a capacitor. By employing passive low-pass filter PLPF2 formed of the resistance elements and the capacitor, therefore, the passive and active low-pass filters PLPF2 and ALPF can be integrated on the same semiconductor substrate. Thereby, the sizes of the receiving circuit can be reduced.

Further, the circuits in the base band circuit 36 other than the active low-pass filters may also be arranged on the same semiconductor substrate CH for further reduction in required layout area.

Although FIG. 19 shows the structure in which passive low-pass filter PLPF2 of the structure shown in FIG. 17 is arranged on semiconductor substrate CH, passive low-pass filter PLF2 of the structure shown in FIG. 18 may be arranged similarly.

Although the present invention has been described and illustrated in detail, it is clearly understood that the same is by way of illustration and example only and is not to be taken by way of limitation, the spirit and scope of the present invention being limited only by the terms of the appended claims.

The wireless terminal device according to the invention can be applied to mobile communication terminals such as a cellular telephone.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wireless terminal device for selectively receiving a desired channel from a plurality of channels, comprising:
   an antenna for receiving a radio-frequency signal including said plurality of channels;
   a local oscillator for oscillating a local oscillation signal;
   a first mixer of a differential type for mixing the radio-frequency signal sent from said antenna with the local oscillation signal sent from said local oscillator to produce a first base band signal and a second base band signal having a phase differing by 180 degrees from that of said first base band signal;
   a first low-pass filter of the differential type and a passive type for receiving said first and second base band signals from said first mixer; and
   a base band circuit for receiving said first and second base band signals passed through said first low-pass filter;
   wherein said first low-pass filter includes:
   a first inductor for passing and transmitting said first base band signal sent from said first mixer to said base band circuit;
   a second inductor for passing and transmitting said second base band signal sent from said first mixer to said base band circuit; and
   a capacitor coupled between said first and second inductors.

2. The wireless terminal device according to claim 1, wherein said first mixer is an even harmonic mixer.

3. The wireless terminal device according to claim 1, further comprising:
   a phase shifter for producing first and second radio-frequency signals having phases differing by 90 degrees from each other in response to the radio-frequency signal sent from said antenna, and applying said first radio-frequency signal to said first mixer;
   a second mixer of the differential type for mixing the second radio-frequency signal sent from said phase shifter with the local oscillation signal sent from said local oscillator to produce a third base band signal and a fourth base band signal having a phase differing by 180 degrees from that of said third base band signal; and
   a second low-pass filter of the differential type and the passive type for receiving said third and fourth base band signals from said second mixer.

4. The wireless terminal device according to claim 3, wherein said first and second low-pass filters are formed of a single element.

5. The wireless terminal device according to claim 3, wherein each of said first and second mixers is an even harmonic mixer.

6. A wireless terminal device for selectively receiving a desired channel from a plurality of channels, comprising:
   an antenna for receiving a radio-frequency signal including said plurality of channels;
   a local oscillator for oscillating a local oscillation signal;
   a first mixer of a differential type for mixing the radio-frequency signal sent from said antenna with the local oscillation signal sent from said local oscillator to produce a first base band signal and a second base band signal having a phase differing by 180 degrees from that of said first base band signal;
   a first low-pass filter of the differential type and a passive type for receiving said first and second base band signals from said first mixer; and
   a base band circuit for receiving said first and second base band signals passed through said first low-pass filter
   wherein said first low-pass filter has a cut-off frequency lower than a channel next to a channel neighboring to said desired channel.

7. The wireless terminal device according to claim 6, wherein said base band circuit includes:
an active low-pass filter for receiving said first and second base band signals passed through said first low-pass filter, and having a cut-off frequency lower than the channel neighboring to said desired channel.

8. The wireless terminal device according to claim 6, wherein said first mixer is an even harmonic mixer.

9. The wireless terminal device according to claim 6, further comprising:
a phase shifter for producing first and second radio-frequency signals having phases differing by 90 degrees from each other in response to the radio-frequency signal sent from said antenna, and applying said first radio-frequency signal to said first mixer;
a second mixer of the differential type for mixing the second radio-frequency signal sent from said phase shifter with the local oscillation signal sent from said local oscillator to produce a third base band signal and a fourth base band signal having a phase differing by 180 degrees from that of said third base band signal; and
a second low-pass filter of the differential type and the passive type for receiving said third and fourth base band signals from said second mixer.

10. The wireless terminal device according to claim 9, wherein each of said first and second mixers is an even harmonic mixer.

11. The wireless terminal device according to claim 9, wherein said first and second low-pass filters are formed of a single element.

12. A wireless terminal device for selectively receiving a desired channel from a plurality of channels, comprising:
an antenna for receiving a radio-frequency signal including said plurality of channels;
a local oscillator for oscillating a local oscillation signal;
a first mixer of a differential type for mixing the radio-frequency signal sent from said antenna with the local oscillation signal sent from said local oscillator to produce a first base band signal and a second base band signal having a phase differing by 180 degrees from that of said first base band signal;
a first low-pass filter of the differential type and a passive type for receiving the first and second base band signals from said first mixer;
a second low-pass filter of the passive type for receiving the first and second base band signals passed through said first low-pass filter, and having a cut-off frequency higher than a cut-off frequency of said first low-pass filter; and
a base band circuit for receiving said first and second base band signals passed through said second low-pass filter.

13. The wireless terminal device according to claim 12, wherein said second low-pass filter includes:
a first inductor for passing and transmitting said first base band signal sent from said first low-pass filter to said base band circuit;
a second inductor for passing and transmitting said second base band signal sent from said first low-pass filter to said base band circuit; and
a capacitor coupled between said first and second inductors.

14. The wireless terminal device according to claim 12, wherein said second low-pass filter includes:

a first resistance element for passing and transmitting the first base band signal sent from said first low-pass filter to said base band circuit;
a second resistance element for passing and transmitting the second base band signal sent from said first low-pass filter to said base band circuit; and
a capacitor coupled between said first and second resistance elements.

15. The wireless terminal device according to claim 12, wherein said first mixer is an even harmonic mixer.

16. The wireless terminal device according to claim 12, wherein said first low-pass filter has the cut-off frequency lower than a channel next to a channel neighboring to said desired channel.

17. The wireless terminal device according to claim 16, wherein said base band circuit includes:
an active low-pass filter for receiving said first and second base band signals passed through said first and second low-pass filters, and having a cut-off frequency lower than the channel neighboring to said desired channel.

18. The wireless terminal device according to claim 17, wherein said second low-pass filter includes:
a first resistance element for passing and transmitting the first base band signal sent from said first low-pass filter to said base band circuit;
a second resistance element for passing and transmitting the second base band signal sent from said first low-pass filter to said base band circuit; and
a capacitor coupled between said first and second resistance elements; and
said second low-pass filter is integrated with at least said active low-pass filter on a common semiconductor substrate.

19. The wireless terminal device according to claim 16, wherein the cut-off frequency of said second low-pass filter is set in accordance with deterioration of attenuation characteristics in a high frequency range of said first low-pass filter.

20. The wireless terminal device according to claim 19, wherein the cut-off frequency of said second low-pass filter is at least 80 MHZ.

21. The wireless terminal device according to claim 12, further comprising:
a phase shifter for producing first and second radio-frequency signals having phases differing by 90 degrees from each other in response to the radio-frequency signal sent from said antenna, and applying said first radio-frequency signal to said first mixer;
a second mixer of the differential type for mixing the second radio-frequency signal sent from said phase shifter with the local oscillation signal sent from said local oscillator to produce a third base band signal and a fourth base band signal having a phase differing by 180 degrees from that of said third base band signal;
a third low-pass filter of the passive type for receiving said third and fourth base band signals from said second mixer; and
a fourth low-pass filter of the passive type for receiving the third and 15 fourth base band signals passed through said third low-pass filter, and having a cut-off frequency higher than a cut-off frequency of said third low-pass filter.

22. The wireless terminal device according to claim 21, wherein each of said first and second mixers is an even harmonic mixer.

* * * * *